United States Patent
Kim

(10) Patent No.: US 9,123,440 B2
(45) Date of Patent: Sep. 1, 2015

(54) NON-VOLATILE SEMICONDUCTOR MEMORY DEVICE AND METHOD OF IMPROVING RELIABILITY USING SOFT ERASING OPERATIONS

(71) Applicant: SK hynix Inc., Icheon-si Gyeonggi-do (KR)

(72) Inventor: Se Hyun Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 184 days.

(21) Appl. No.: 13/717,285

(22) Filed: Dec. 17, 2012

(65) Prior Publication Data

US 2014/0056091 A1 Feb. 27, 2014

(30) Foreign Application Priority Data

Aug. 24, 2012 (KR) .................. 10-2012-0093182

(51) Int. Cl.
  G11C 11/56 (2006.01)
  G11C 7/00 (2006.01)
  G11C 16/04 (2006.01)
  G11C 16/34 (2006.01)

(52) U.S. Cl.
  CPC *G11C 11/56* (2013.01); *G11C 7/00* (2013.01); *G11C 11/5628* (2013.01); *G11C 11/5635* (2013.01); *G11C 16/0483* (2013.01); *G11C 16/3418* (2013.01)

(58) Field of Classification Search
  CPC ............ G06F 12/0246; G06F 11/1072; G06F 3/0614; G06F 2212/1032; G11C 2211/5641; G11C 16/349; G11C 16/16; G11C 13/0035; H01L 29/7923; H01L 21/28273; H01L 29/42324; H01L 29/7781; H01L 29/7883
  USPC .................. 365/218, 185.29, 185.33; 711/103
  See application file for complete search history.

(56) References Cited

U.S. PATENT DOCUMENTS

2009/0193184 A1* 7/2009 Yu et al. ...................... 711/103
2010/0149881 A1* 6/2010 Lee et al. .................. 365/185.33

FOREIGN PATENT DOCUMENTS

KR 1020090074763 A 7/2009
KR 1020100135444 A 12/2010

* cited by examiner

*Primary Examiner* — Richard Elms
*Assistant Examiner* — Ajay Ojha
(74) *Attorney, Agent, or Firm* — William Park & Associates Ltd.

(57) ABSTRACT

A method of operating a semiconductor memory device, given the case where memory cells have an erase state less than a first reference voltage and a plurality of program states greater than the first reference voltage, includes performing an erase operation so that the memory cells have a soft erase state less than a second reference voltage, and performing a program operation so that each of the memory cells has the soft erase state or one program state greater than the second reference voltage.

11 Claims, 5 Drawing Sheets

NON-VOLATILE SEMICONDUCTOR MEMORY DEVICE AND METHOD OF IMPROVING RELIABILITY USING SOFT ERASING OPERATIONS

CROSS-REFERENCE TO RELATED APPLICATION

This application claims priority from Korean Patent Application No. 10-2012-0093182, filed on Aug. 24, 2012, the contents of which are incorporated herein by reference in its entirety.

BACKGROUND

The present invention relates generally to a semiconductor memory device.

A semiconductor memory device refers to a memory device embodied by using a semiconductor such as silicon Si, germanium Ge, gallium arsenide GaAs, indium phospide Inp, etc. The semiconductor memory device is classified into a volatile memory device or a non-volatile memory device.

The volatile memory device has a characteristic where stored data is lost if power is not supplied. Examples of volatile memory devices include a static RAM SRAM, a dynamic RAM DRAM, a synchronous DRAM SDRAM and so on. The non-volatile memory device has a characteristic where stored is not lost even if power is not supplied. Examples of non-volatile memory devices include a read only memory ROM, a programmable ROM PROM, an electrically programmable ROM EPROM, an electrically erasable and programmable ROM EEPROM, a flash memory, a phase-change RAM PRAM, a magnetic RAM MRAM, a resistive RAM RRAM, a ferroelectric RAM FRAM, etc. The flash memory device is further classified into a NOR-type memory device or a NAND-type memory device.

A memory cell array of a semiconductor memory device such as a flash memory device is supplied high voltage when a program operation and an erase operation are performed. Accordingly, as the program/erase cycle increases, the deterioration of the memory cell array of the semiconductor memory device increases. Deterioration of the memory cells leads to reduced reliability within the stored data, which in return leads to reduced reliability of the entire semiconductor memory device.

SUMMARY OF THE INVENTION

Various embodiments of the present invention describe a semiconductor memory device of which deterioration is prevented.

A method of operating a semiconductor memory device according to an embodiment of the present invention, given the case where memory cells have an erase state less than a first reference voltage and a plurality of program states greater than the first reference voltage, includes: performing an erase operation so that the memory cells have a soft erase state less than a second reference voltage in response to an erase request, and performing a program operation so that each of the memory cells has the soft erase state or one program state greater than the second reference voltage in response to a program request. Given the above case, the second reference voltage is greater than the first reference voltage. The memory cells described above refer to memory cells coupled to one word line. Each of the memory cells stores multiple bits before the erase operation is performed, and each of the memory cells stores a single bit according to the program operation.

The second reference voltage may be greater than or equal to a threshold voltage corresponding to one of the program states.

One of the program states may correspond to a lowest program state among the plurality of program states.

A semiconductor memory device according to another embodiment of the present invention includes memory cells configured to have an erase state less than a first reference voltage and a plurality of program states greater than the first reference voltage, and a peripheral circuit configured to perform an erase operation in response to an erase request so that the memory cells have a soft erase state less than a second reference voltage in response to the erase request, and to perform a program operation so that the memory cells have the soft erase state and one program state greater than the second reference voltage in response to a program request. The second reference voltage may be greater than the first reference voltage.

A method of operating a semiconductor memory device according to another embodiment of the present invention includes programming memory cells so that the memory cells have an erase state and a plurality of program states, and performing an erase operation to the memory cells by using a reference voltage which is greater than or equal to a threshold voltage corresponding to one of the plurality of program states, in response to an erase request.

The memory cells may have threshold voltages of a soft erase state that are lower than the reference voltage according to the erase operation. The method may further include performing a program operation so that the memory cells have the soft erase state and one program state higher than the reference voltage in response to the program request.

The programming of the memory cells may comprise programming the memory cells to have the erase state and a first to a third program states, where the first program state corresponds to the lowest threshold voltage of the first to the third program states, and the third program state corresponds to the highest threshold voltage of the first to the third program states.

In embodiments of the present invention, deterioration of a semiconductor memory device may be prevented.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION

Hereinafter, the preferred embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between," "adjacent" versus "directly adjacent," etc.).

Figure 1:
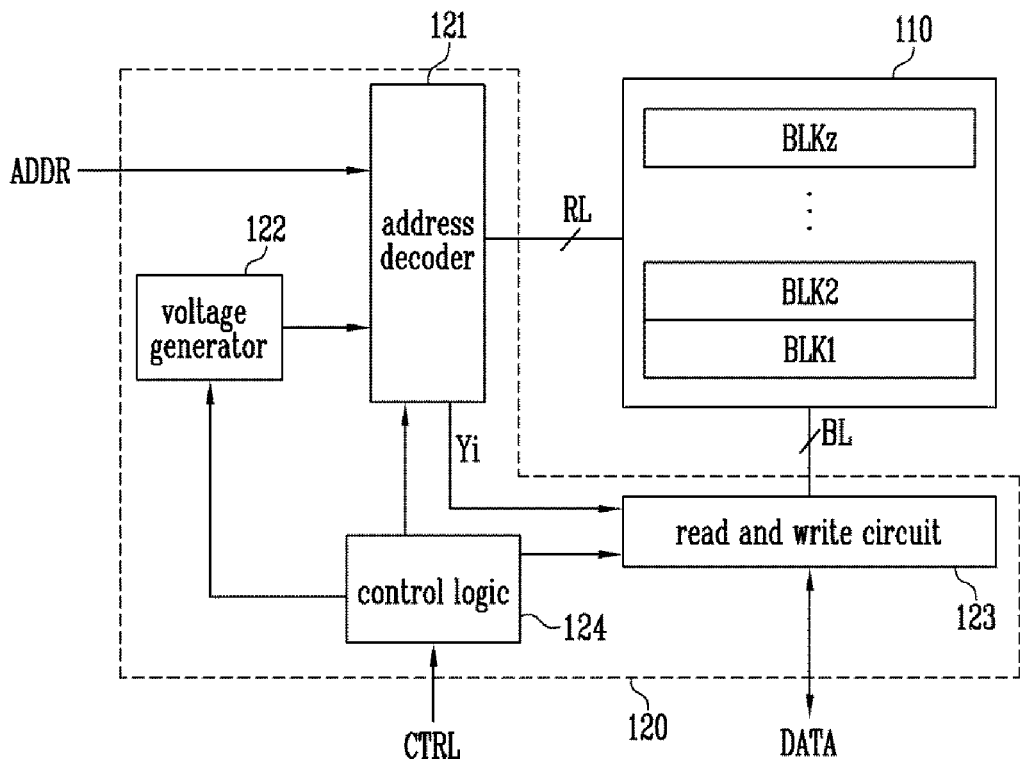
FIG. 1 is a block diagram illustrating a semiconductor memory device according to an embodiment of the present invention.

FIG. 1 is a block diagram illustrating a semiconductor memory device according to an embodiment of the present invention.

In FIG. 1, the semiconductor memory device 100 may include a memory cell array 110 and a peripheral circuit 120 for driving the memory cell array 110.

The memory cell array 110 includes memory blocks BLK1-BLKz that are coupled to an address decoder 121 through row lines RL and coupled to a read and write circuit 123 through bit lines BL. Each of the memory blocks BLK1-BLKz includes memory cells. In an embodiment of the present invention, the memory cells are non-volatile memory cells, and may be a single-level cell or a multi-level cell.

The peripheral circuit 120 drives the memory cell array 110 and may include an address decoder 121, a voltage generator 122, the read and write circuit 123 and a control logic 124.

The address decoder 121 is coupled to the memory cell array 110 through the row lines RL, which in turn are coupled to one memory block that includes a drain select line, word lines, and a source select line. The address decoder 121 operates in response to control of the control logic 124, and receives an address ADDR from an external device or an input/output buffer (not shown) in the semiconductor memory device 100.

The address decoder 121 decodes a block address of the received address ADDR and selects at least one memory block according to the decoded block address.

The address decoder 121 decodes a row address of the received address ADDR and selects one of the word lines coupled to a selected memory block according to the decoded row address.

The address decoder 121 decodes a column address of the received address ADDR and transmits the decoded column address Yi to the read and write circuit 123.

A read operation and a program operation of the semiconductor memory device 100 are performed in a page, where one page is defined as a plurality of memory cells. In the read operation or the program operation, the address ADDR may include the block address, the row address, and the column address. The address decoder 121 selects one memory block and one word line according to the address ADDR, and provides the decoded column address Yi to the read and write circuit 123.

An erase operation of the semiconductor memory device 100 is performed in a memory block. In the erase operation, the address ADDR may include a block address. The address decoder 121 may select one memory block according to the address ADDR.

The address decoder 121 may include a block decoder, a row decoder, a column decoder, and an address buffer, etc.

The voltage generator 122 generates voltages by using a supply voltage supplied to the semiconductor memory device 100. The voltage generator 122 operates in response to control of the control logic 124. In an embodiment of the present invention, the voltage generator 122 may include pumping capacitors, and generate voltages by activating selective pumping capacitors. The generated voltages are supplied to the address decoder 121.

The read and write circuit 123 is coupled to the memory cell array 110 through the bit lines BL. The read and write circuit 123 operates in response to control of the control logic 124.

In the program operation and the read operation, the read and write circuit 123 communicates data DATA with the external device or the input/output buffer (not shown) of the semiconductor memory device 100. In the program operation, the read and write circuit 123 receives the data DATA to be programmed. The read and write circuit 123 delivers the received data DATA to the bit lines corresponding to the decoded column address Yi of the bit lines BL whenever a program pulse is provided to the word line selected by the address decoder 121. The delivered data DATA is then programmed to memory cells of the selected word line. In the read operation, the read and write circuit 123 reads data from memory cells of the selected word line through bit lines corresponding to the decoded column address Yi of the bit lines BL, and outputs the read data. In the erase operation, the read and write circuit 123 floats may float the bit lines BL.

In an embodiment of the present invention, the read and write circuit 130 may include page buffers (or page registers), a column select circuit, etc.

The control logic 124 is coupled to the address decoder 121, the voltage generator 122, and the read and write circuit 123. The control logic 124 receives a control signal CTRL from an external device or the input/output buffer (not shown)_ of the semiconductor memory device 100, and controls operation of the semiconductor memory device 100 in response to the control signal CTRL.

The semiconductor memory device 100 may further include the input/output buffer (not shown). The input/output buffer receives the control signal CTRL and the address ADDR from the external device, and delivers the received control signal CTRL and the address ADDR to the control logic 124 and the address decoder 121, respectively. Additionally, the input/output buffer delivers the data DATA inputted from the external device to the read and write circuit 123, and delivers the data DATA provided from the read and write circuit 123 to an external device.

In an embodiment of the present invention, the semiconductor memory device 100 may be a flash memory device.

Figure 2:
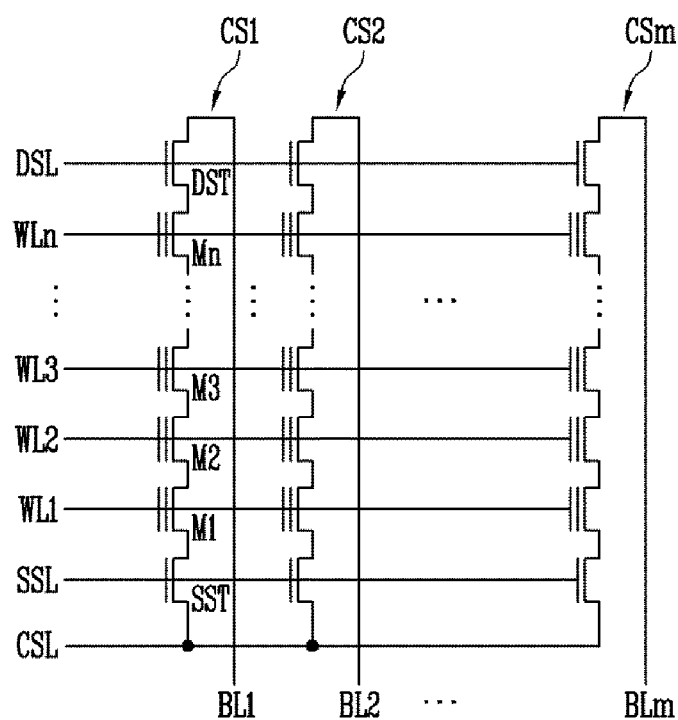
FIG. 2 is a view illustrating a circuit diagram of one of the memory blocks in FIG. 1.

FIG. 2 is a view illustrating a circuit diagram of one of the memory blocks in FIG. 1.

In FIG. 2, a first memory block BLK1 is coupled to the read and write circuit 123 in FIG. 1 through first to mth bit lines BL1-BLm. The first memory block BLK1 is coupled to the address decoder 121 in FIG. 1 through a common source line CSL, a source select line SSL, first to nth word lines WL1-WLn, and a drain select line DSL. The source select line SSL, the first to nth word lines WL1-WLn, and the drain select line DSL in FIG. 2 are included in the row lines RL in FIG. 1.

The first memory block BLK1 includes first to mth cell strings CS1-CSm that are coupled to the first to mth bit lines BL1-BLm, respectively. Each of the cell strings includes a source select transistor SST coupled to the source select line SSL, first to nth memory cells M1-Mn coupled to the first to nth word lines WL1-WLn, and a drain select transistor DST coupled to the drain select line DSL. A source terminal of the source select transistor SST in each of the cell strings is coupled to the common source line CSL. A drain terminal of the drain select transistor DST in each of the cell string is coupled to a corresponding bit line.

Memory cells coupled to one word line form one or more page. Accordingly, if the memory cell is a single-level cell, memory cells coupled to one word line form one page. If the memory cell is a multi-level cell, memory cells coupled to one word line form multiple pages.

The second to zth memory blocks BLK2-BLKz in FIG. 1 may have a substantially similar constitution as the first memory block BLK1 in FIG. 2.

Figure 3:
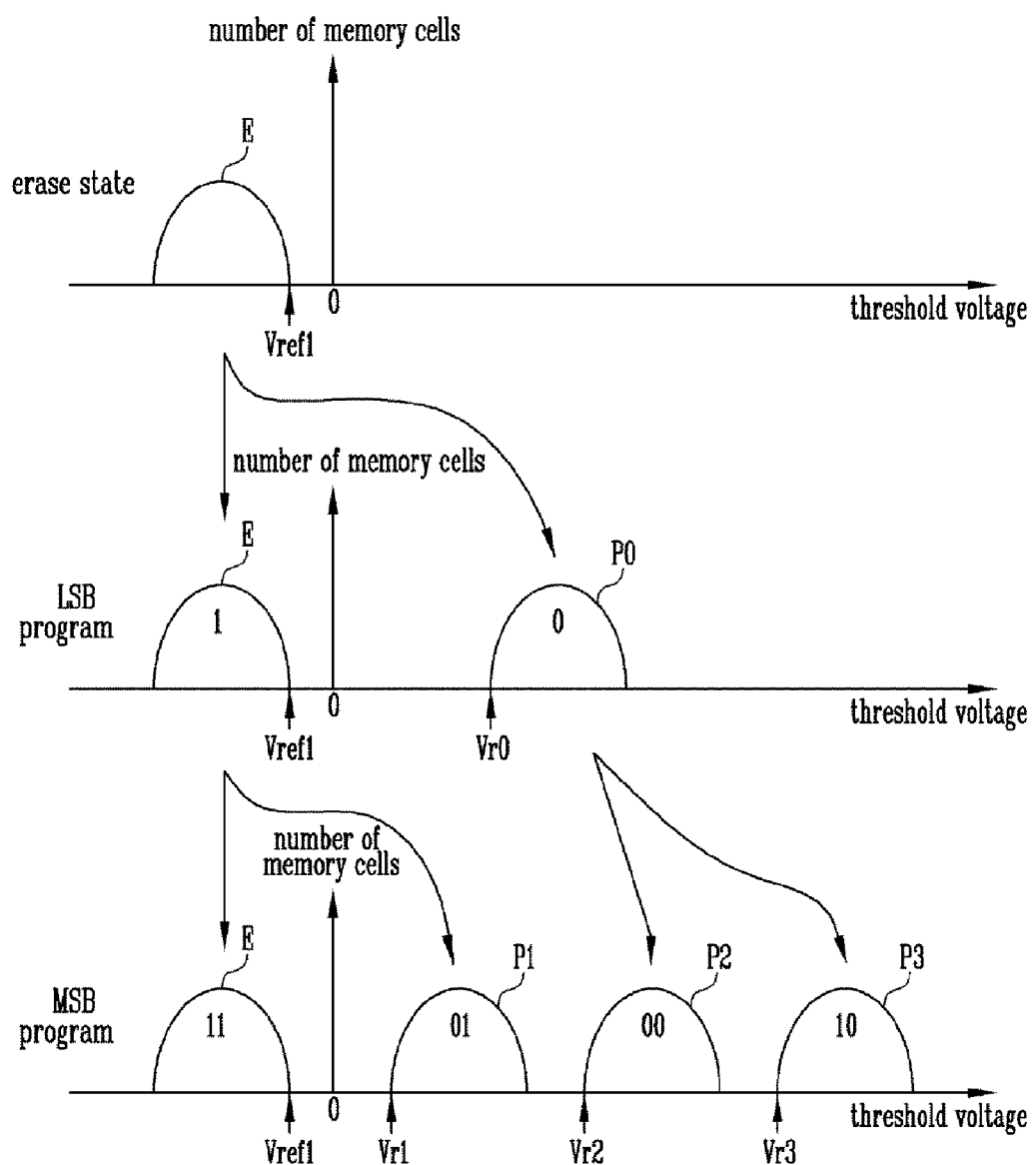
FIG. 3 is a diagram illustrating a change of threshold voltage distribution of memory cells in a least significant bit LSB program operation and a most significant bit MSB program operation.

FIG. 3 is a diagram illustrating a change of threshold voltage distribution of memory cells in a least significant bit LSB program operation and a most significant bit MSB program operation. In FIG. 3, the horizontal axis indicates the threshold voltages, and the vertical axis indicates the number of memory cells.

In FIG. 3, threshold voltages of the memory cells are less than a first reference voltage Vref1 when the memory cells have an erase state E. Here, the first reference voltage Vref1 is a voltage smaller than 0V.

In the least significant bit LSB program, the memory cells having the erase state E are programmed to have the erase state E or a 0th program state P0. The peripheral circuit 120 in FIG. 1 performs the program operation so that memory cells in which data "1" is to be stored remain as the erase state E and memory cells in which data "0" is to be stored have the 0th program state P0 according to data to be programmed. In the LSB program, a 0th verifying voltage Vr0 is used for the 0th program state P0.

The program operation includes a step of increasing threshold voltages of memory cells such as memory cells of P0 by providing a program pulse to a selected word line, a step of verifying whether threshold voltages of the memory cells to be programmed are higher than a verifying voltage such as Vr0, and a step of further increasing the threshold voltages of the memory cells to be programmed by using the increased program pulse according to the verifying result. In the event that the program pulse is provided, a supply voltage for inhibition of programming is supplied to bit lines corresponding to memory cells such as memory cells of E, of which programming is inhibited, and a ground voltage is supplied to bit lines corresponding to the memory cells to be programmed.

The MSB program operation is performed after the LSB program operation is performed. The memory cells having the erase state E may be programmed to have the erase state E or a first program state P1. Memory cells having the 0th program state may be programmed to have a second program state P2 or a third program state P3. In the MSB program operation, the first verifying voltage Vr1 is used for the first program state P1, a second verifying voltage Vr2 is used for the second program state P2, and a third verifying voltage Vr3 is used for the third program state P3.

In an embodiment of the present invention, the erase state E, the first program state P1, the second program state P2, and the third program state P3 may correspond to data "11," data "01," data "00," and data "10," respectively. Least significant bits of data "11," "01," "00," and "10" are "1," "1," "0," and "0", respectively. Most significant bits of data "11," "01," "00," and "10" are "1," "0," "0," and "1", respectively.

As described in FIG. 3, the number of bits stored in the memory cell may be adjusted by changing the threshold voltage distribution of the memory cells. For example, each of the memory cells may store plural bits or a single bit.

Figure 4:
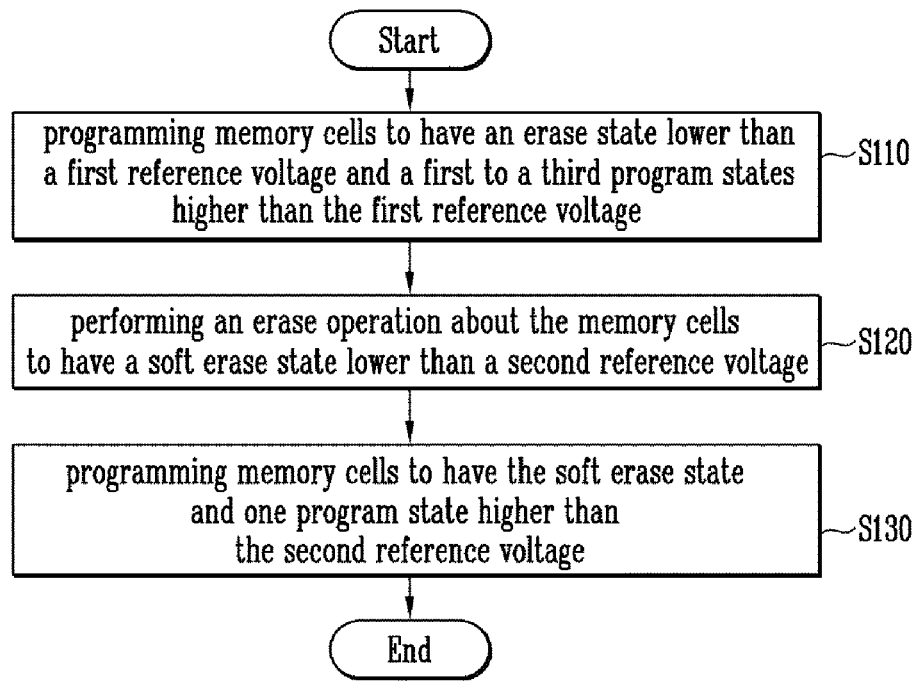
FIG. 4 is a flowchart illustrating operation of a semiconductor memory device according to an embodiment of the present invention.
Figure 5:
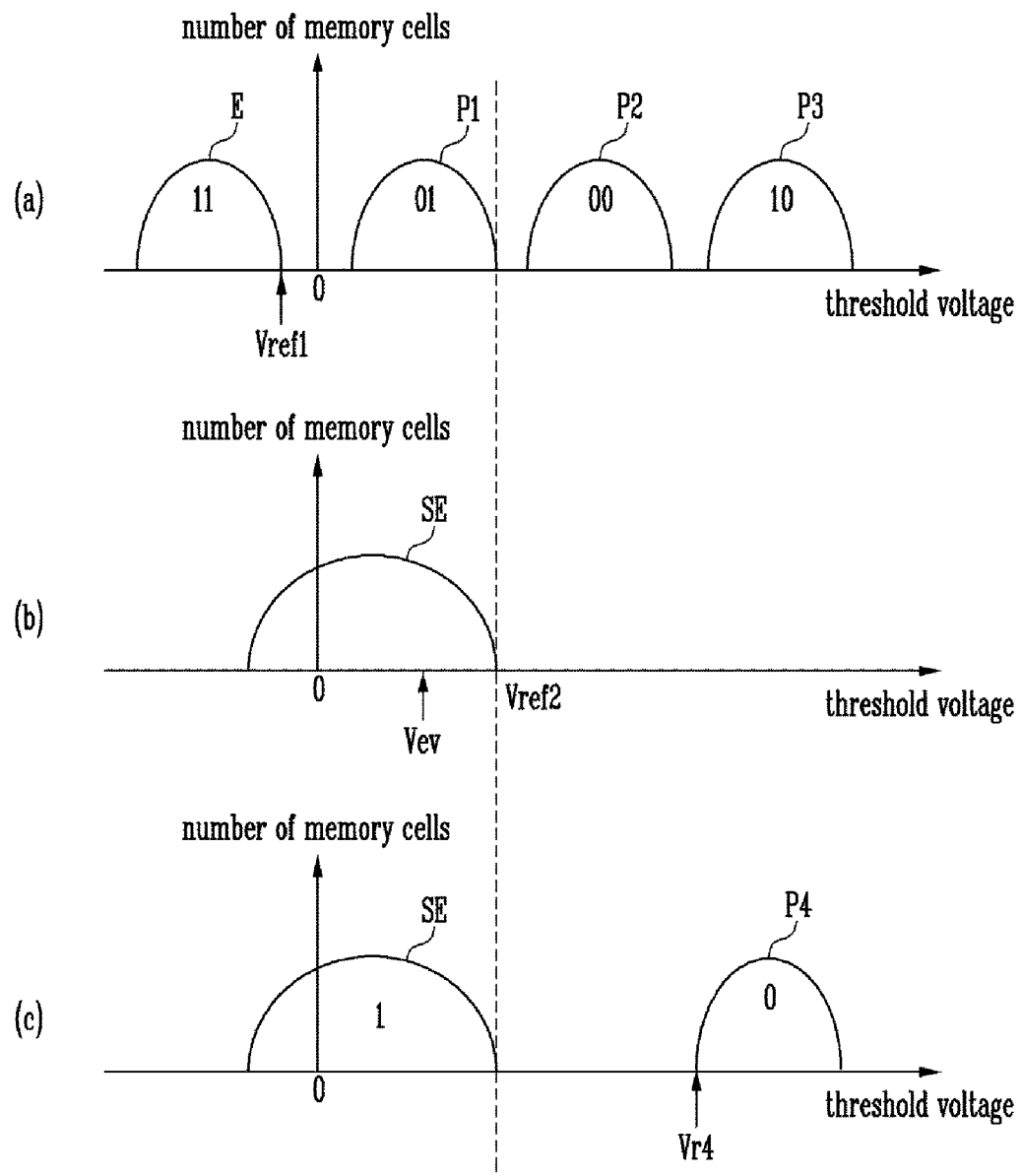
FIG. 5 is a diagram illustrating a process of changing threshold voltage distribution of memory cells according to the operation in FIG. 4.
Figure 6:
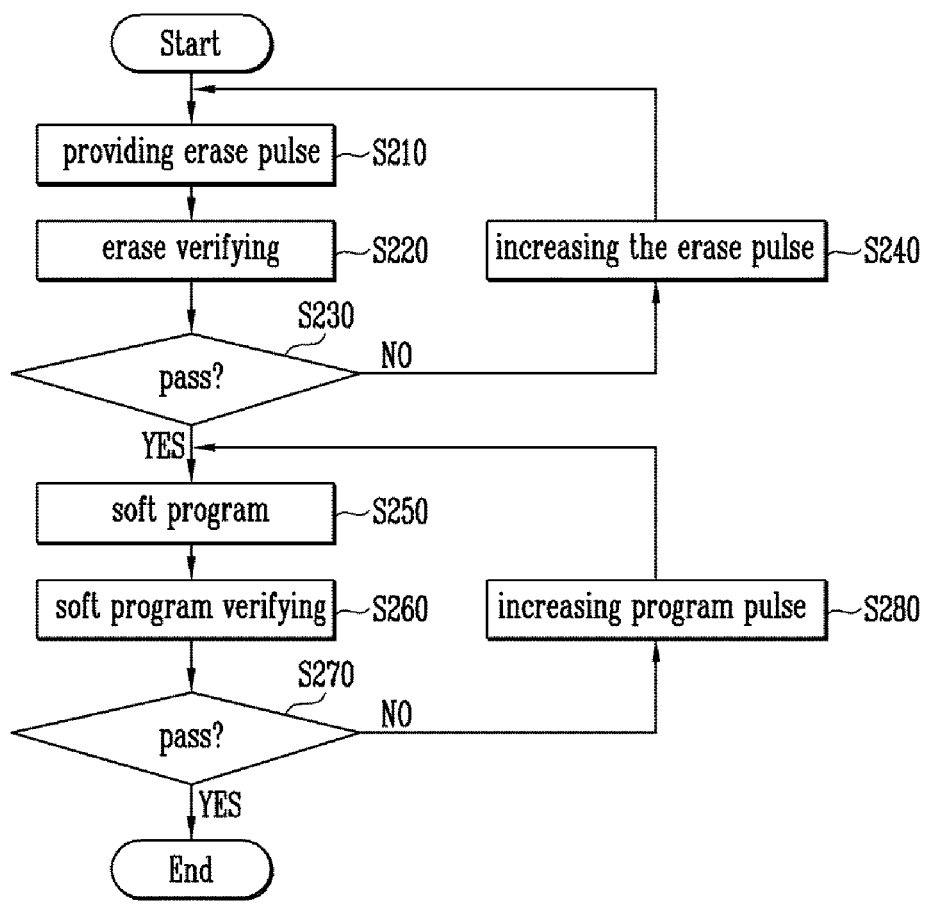
FIG. 6 is a flowchart illustrating an erase operation of a semiconductor memory device according to an embodiment of the present invention.

FIG. 4 is a flowchart illustrating operation of a semiconductor memory device according to an embodiment of the present invention. FIG. 5 is a diagram illustrating a process of changing the threshold voltage distribution of memory cells according to the operation in FIG. 4. FIG. 6 is a flowchart illustrating an erase operation of a semiconductor memory device according to an embodiment of the present invention.

In FIG. 4 and (a) of FIG. 5, memory cells are programmed to an erase state E that is lower than a first reference voltage Vref1 and a first to third program states P1 to P3 that are higher than the first reference voltage Vref1 in step S110. 2 bits are stored in each of the memory cells.

In step S120, an erase operation is performed so that the memory cells have a soft erase state lower than a second reference voltage Vref2. The second reference voltage Vref2 may be higher than the first reference voltage Vref1.

In an embodiment of the present invention, an erase operation for a multi-level cell is performed by using the reference voltage Vref2. In (b) of FIG. 5, the soft erase state SE is lower than the second reference voltage Vref2. In an embodiment of the present invention, the second reference voltage Vref2 may be greater than or equal to the threshold voltage corresponding to the first program state P1. Memory cells having threshold voltages lower than the second reference voltage Vref2 may be defined as memory cells that do not store data. Memory cells having threshold voltages between the first and the second reference voltages Vref1 and Vref2 of the memory cells having the soft erase state SE are defined as memory cells that do not store data, as opposed to when 2 bits are stored in each of the memory cells described above.

The second reference voltage Vref2 is comparatively high. The number of erase pulses provided to a bulk area of the memory cell array 110 may decreased compared to when the first reference voltage Vref1 is used. Levels of the erase pulses may also reduce. Accordingly, deterioration of the memory cell array 110 may reduce.

Hereinafter, an erase operation will be described in detail. In FIG. 6, an erase pulse is provided to the bulk area of the selected memory block when the erase operation is performed in step S210. A ground voltage may be supplied to word lines coupled to the selected memory block. As a result, threshold voltages of memory cells included in the selected memory block may decrease.

In step S220, an erase verifying operation is performed. In an embodiment of the present invention, the erase verifying operation is performed by using the second reference voltage Vref2 or an erase verifying voltage Vev less than the second reference voltage Vref2.

Hereinafter, it is assumed that the erase verifying operation is performed by using the erase verifying voltage Vev. In the erase verifying operation, the bit lines BL1-BLm in FIG. 2 are precharged, the erase verifying voltage Vev is supplied to the word lines WL1-WLn in FIG. 2, and a supply voltage is provided to the select lines SSL and DSL in FIG. 2. The select transistors SST and DST are turned on. In the event that every memory cell such as M1-Mn included in one string such as CS1 is turned on, electric charges precharged to the bit line are discharged to the common source line CSL in FIG. 2. In the event that one or more of memory cells included in one string is turned off, electric charges precharged to the bit line are not discharged to the common source line CSL. Here, threshold voltages of the memory cells included in one string may be detected by sensing voltage change of the bit lines.

When the erase verifying operation passes in step S230, step S250 is performed, and when the erase verifying operation fails, step S240 is performed. The step S250 may be performed when every memory cell has a threshold voltage less than the erase verifying voltage Vev. The step S240 may be performed when at least one memory cell has a threshold voltage greater than the erase verifying voltage Vev.

The erase pulse increases in step S240. The increased erase pulse may be provided to the bulk area when the step S210 is performed again.

The memory cells have threshold voltages less than the erase verifying voltage Vev according to step S210 to step S240.

In step S250, a soft program is performed in memory cells of the selected memory block. A program pulse is provided to the word lines WL1-WLn of the selected memory block. A ground voltage is supplied to the bit lines BL1-BLm, the supply voltage is provided to the drain select line DSL, and thus voltages of the bit lines BL1-BLm may be delivered to channels of the cell strings CS1-CSm, respectively. Consequently, the threshold voltages of the memory cells in the selected memory block increase by a small value.

The program pulse used in the soft program operation is less than that used in the program operation of storing data. Accordingly, increased amounts of the threshold voltages of memory cells in the selected memory block in the soft program operation are less than those in the program operation.

In step S260, a soft program verifying step is performed. The soft program verifying step is performed by using the second reference voltage Vref2. Particularly, the bit lines BL1-BLm are precharged, and the second reference voltage Vref2 is supplied to the word lines WL1-WLn. The select transistors SST and DST are turned on by supplying the supply voltage thereto. In the event that every memory cell such as M1-Mn included in one string such as CS1 is turned on, electric charges precharged to corresponding bit line are discharged to the common source line CSL. In the event that at least one of the memory cells included in one string is turned off, the electric charges precharged to the bit line are not discharged to the common source line CSL. Voltage change of the bit lines BL1-BLm determine whether the memory cells in the cell string have threshold voltages less than the second reference voltage Vref2 or whether at least one of the memory cells in the cell string has a threshold voltage greater than the second reference voltage Vref2.

In step S270, the program operation is finished when the soft program verifying passes. In the event that the soft program verifying fails, the program pulse is increased in step S280, and step S250 and the following steps are performed again by using the increased program pulse.

In an embodiment of the present invention, the program operation is finished when one or more of the memory cells in the selected memory block have a threshold voltage greater than the second reference voltage Vref2. Particularly, in the event that at least one of the memory cells in the selected memory block is turned off, the voltage of the bit line coupled to the string does not decrease. In the event that the bit line of which the voltage does not decrease exists according to the soft program verifying, the soft program operation is finished.

In an embodiment of the present invention, the step S280 is performed when every memory cell in the selected memory block has a threshold voltage less than the second reference voltage Vref2.

The erase operation described in FIG. 6 is one embodiment of the present invention. A method of performing the erase operation may be variously modified. For example, the soft program operation and the soft program verifying in FIG. 6 may be omitted.

Referring to FIG. 4, the program operation is performed so that the memory cells have the soft erase state and a program state greater than the second reference voltage Vref2 in step S130. In (c) of FIG. 5, the memory cells having the soft erase state SE are maintained or are programmed to a fourth program state P4. Each of the memory cells may be programmed to have one of two states, and thus may only need to store one bit.

In an embodiment of the present invention, the control logic 124 may receive a control signal, for setting the memory cell in the memory cell array 110 to a single-level cell, from an external device between the step S120 and the step S130. The memory cell in the memory cell array 110 may be used as the single-level cell in response to the control signal as described in step S130.

In an embodiment of the present invention, the multi-level cell may be converted into the single-level cell. The erase operation for the multi-level cell is performed by using the reference voltage Vref2. The supplying number of the erase pulses to the bulk area of the memory cell array 110 or levels of the erase pulses may decrease. Accordingly, deterioration of the memory cell array 110 may decrease.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A method of operating a semiconductor memory device given the case where memory cells have an erase state less than a first reference voltage and a plurality of program states greater than the first reference voltage, the method comprising:
    performing an erase operation so that the memory cells have a soft erase state less than a second reference voltage in response to an erase request, wherein the second reference voltage is greater than the first reference voltage; and
    performing a program operation so that each of the memory cells has the soft erase state or one program state greater than the second reference voltage in response to a program request,
    wherein the second reference voltage is greater than or equal to a threshold voltage corresponding to one of the program states.

2. The method of claim 1, wherein each of the memory cells stores multiple bits before the erase operation is performed, and each of the memory cells stores a single bit according to the program operation.

3. The method of claim 1, wherein the one of the program states corresponds to a lowest program state among the plurality of program states.

4. The method of claim 1, wherein the second reference voltage is greater than a ground voltage.

5. A semiconductor memory device comprising:
    memory cells configured to have an erase state less than a first reference voltage and a plurality of program states greater than the first reference voltage; and
    a peripheral circuit configured to perform an erase operation so that the memory cells have a soft erase state less than a second reference voltage in response to an erase request, and perform a program operation so that the memory cells have the soft erase state and one program state greater than the second reference voltage in response to a program request, wherein the second reference voltage is greater than the first reference voltage, wherein the second reference voltage is greater than or equal to a threshold voltage corresponding to one of the program states.

6. The semiconductor memory device of claim 5, wherein each of the memory cells stores multiple bits before the erase operation is performed and the each of the memory cells stores a single bit according to the program operation.

7. A method of operating a semiconductor memory device, the method comprising:

programming memory cells so that the memory cells have an erase state and a plurality of program states; and performing an erase operation to the memory cells by using a reference voltage which is greater than or equal to a threshold voltage corresponding to one of the plurality of program states, in response to a erase request.

8. The method of claim 7, wherein the memory cells have threshold voltages of a soft erase state less than the reference voltage according to the erase operation, and the method further comprising:

performing a program operation so that the memory cells have the soft erase state and one program state greater than the reference voltage in response to a program request.

9. The method of claim 8, wherein each of the memory cells stores multiple bits before the erase operation and each of the memory cells stores a single bit according to the program operation after the erase operation is performed.

10. The method of claim 7, wherein the one of the plurality of program states corresponds to a lowest program state among the program states.

11. The method of claim 7, wherein the programming of the memory cells comprises programming the memory cells to have the erase state and a first to a third program states, wherein the first program state corresponds to a lowest threshold voltage of the first to the third program states, and the third program state corresponds to a highest threshold voltage of the first to the third program states.

* * * * *